United States Patent [19]
Trah et al.

[11] Patent Number: 5,344,117
[45] Date of Patent: Sep. 6, 1994

[54] MICRO-ACTUATOR

[75] Inventors: Hans-Peter Trah, Reutlingen; Gottfried Flik, Leonberg, both of Fed. Rep. of Germany

[73] Assignee: Robert Bosch GmbH, Stuttgart, Fed. Rep. of Germany

[21] Appl. No.: 135,606

[22] Filed: Oct. 12, 1993

[30] Foreign Application Priority Data

Oct. 10, 1992 [DE] Fed. Rep. of Germany ....... 4234237

[51] Int. Cl.$^5$ .................... F16K 31/02; F16K 31/70
[52] U.S. Cl. .................................. 251/11; 60/528; 60/529; 137/80; 137/468; 251/129.06
[58] Field of Search ............... 251/11, 129.06, 129.01; 137/80, 468

[56] References Cited

U.S. PATENT DOCUMENTS

| | | |
|---|---|---|
| 4,203,128 | 5/1980 | Guckel et al. |
| 5,058,856 | 10/1991 | Gordon et al. |
| 5,069,419 | 12/1991 | Jerman ............................ 251/11 |
| 5,161,774 | 11/1992 | Engelsdorf ...................... 251/11 |

FOREIGN PATENT DOCUMENTS

| | | |
|---|---|---|
| 1199350 | 7/1970 | Canada. |
| 0124250 | 11/1984 | European Pat. Off.. |
| 3505925 | 8/1985 | Fed. Rep. of Germany. |
| 3814616 | 11/1989 | Fed. Rep. of Germany. |
| 3809597 | 3/1990 | Fed. Rep. of Germany. |

OTHER PUBLICATIONS

D. W. Satchell et al., "A Thermally-Excited Silicon Accelerometer", *Sensors & Actuators*, vol. 17, pp. 241–245 (1989).

K. E. Petersen, "Silicon as a Mechanical Material", *Proceedings of the IEEE*, vol. 70, No. 5, pp. 420–457 (May 1982).

T. Ohnstein et al., "Micromachined Silicon Microvalve", *IEEE*, pp. 95–99 (Apr. 1990).

*Primary Examiner*—Arnold Rosenthal
*Attorney, Agent, or Firm*—Kenyon & Kenyon

[57] ABSTRACT

A micro-actuator includes force elements and compensation elements arranged on a bending element such that a change in the environmental temperature does not cause any flexing of the bending element.

12 Claims, 2 Drawing Sheets

MICRO-ACTUATOR

BACKGROUND OF THE INVENTION

The present invention is based on a micro-actuator having a bending element and at least one force element Arranged on the bending element and having a variable length relative to the bending element. U.S. Pat. No. 5,058,856 describes a micro-valve having a micro-actuator designed as a bending element. A force element is arranged on the bending element and has a length relative to the bending element which varies as a result of heating. A frequency-analog accelerometer constructed from three beams is described in D. W. Satchell et al., "A Thermally-Excited Silicon Accelerometer", *Sensors and Actuators*, Vol. 17, pp. 241–245 (May 3, 1989) ("the Satchell article"). The central beams are thermomechanically excited into oscillation and thus likewise represent a micro-actuator.

A micro-pump as a drive for an ink-jet nozzle is described in K. E. Petersen, "Silicon as a Mechanical Material", *Proceedings of the IEEE*, Vol. 70, No. 5, pp. 420–457 (May 1982) ("the Petersen article"). As FIG. 21 on page 433 of the Petersen article shows, a piezoelectric crystal is fitted to a membrane as the force element. German Patent Application No. 42 20 226 describes magnetostrictive force elements arranged on bending elements.

However, in each of these known devices, the characteristic of the bending element disadvantageously varies with changes in environmental temperature. Hence, a micro-actuator including a bending element having a constant characteristic over wide temperature ranges thereby avoiding the need to provide a constant temperature environment is desired.

SUMMARY OF THE INVENTION

The micro-actuator of the present invention provides a compensating element on the bending element. Thus, in the device of the present invention, a force effect of the force element on the bending element caused by a change in the environmental temperature is compensated for by the compensation element. As a result of this measure, flexing of the bending element resulting from a change in the environmental temperature is avoided or greatly reduced. These micro-actuators can therefore be used over a particularly wide temperature range. Since the bending elements have the same characteristic over the entire temperature range, additional measures to keep the temperature of the bending element constant are not needed.

The bending element of the present invention has a particularly simple design and includes edge regions and central regions. At least two opposite edge regions are clamped in a rigid frame. The force element is located in one of either the central regions or the edge regions while the compensation elements are located in the other of the central regions or the edge regions. Reinforcement of the central region creates a region in the center of the bending element which is moved in its entirety as a unit and is thus particularly suitable for using the adjustment movement of the micro-actuator. A typical application of such reinforcement would be, for example, the valve seat of a micro-valve.

In one embodiment, the bending element is constructed as a bending beam or membrane. The range of design possibilities of micro-actuators increases with an increasing number of bending beams or membranes. If individual bending beams or membranes are each provided only with force or compensation elements, then the respective bending beams or membranes can be designed based on the requirements of their specific application. Suitable bending elements can be produced particularly easily from single-crystal silicon. The length of the force element can be varied particularly easily based on either the magnetostrictive effect, the piezoelectric effect, or as a result of a thermally caused length change. The micro-actuators of the present invention can be used particularly advantageously for the drive of a micro-valve, of a micro-pump or of a frequency-analog sensor.

DETAILED DESCRIPTION

Figure 1:
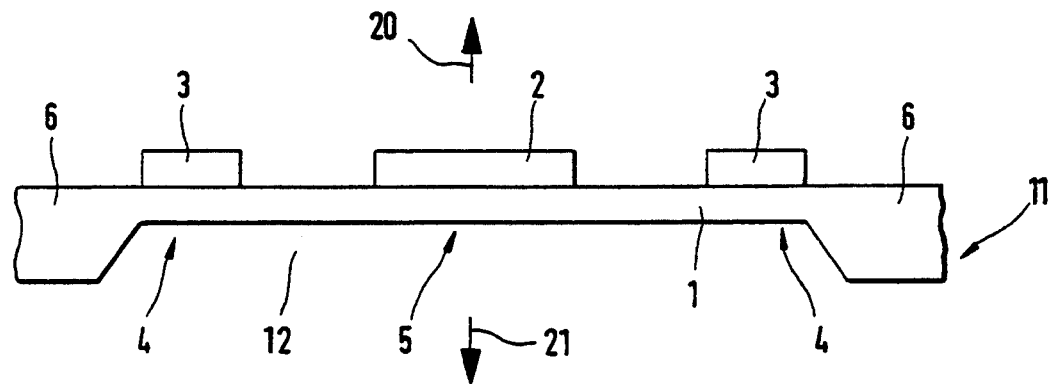
FIG. 1 is a cross sectional side view illustrating a bending element of the present invention.

FIG. 1 is a cross sectional side view illustrating a bending element 1 having a force element 2, which is fitted thereto and which is located in the central region 5. Compensation elements 3 are located in the edge region 4. The bending element 1 is firmly clamped in a frame 6 at its edge regions 4. The bending element 1 and the frame 6 are fabricated from a silicon wafer 11 and are defined by a recess 12.

The lengths of the force element 2 and the compensation elements 3 (i.e., their extent parallel to the surface of the bending element 1) are variable relative to the length of the bending element 1. An upward flexing of the bending element 1, as is indicated by the arrow 20, or a downward flexing, as is indicated by the arrow 21, is induced based on the changes in length of the force element 2 and of the compensation elements 3. An upward flexing of the bending element 1 is induced by a lengthening of the force element 2 while a downward flexing of the bending element 1 is induced by a shortening of the force element 2. Conversely a downward flexing of the bending elements is induced by a lengthening of the compensation elements 3 while an upward flexing of the bending element 1 is induced by a shortening of the compensation elements 3. If the lengths of the force element 2 and of the compensation elements 3 simultaneously increase, the resulting effects on the bending element 1 are directly opposed (i.e., negated).

Therefore, if the force element 2 and the compensation elements 3 are suitably-designed, no flexing, or only a slight flexing, of the bending element 1 results during such a simultaneous increase in length. A similar negating effect occurs during a simultaneous shortening of the lengths of the force element 2 and of the compensation elements 3. Such length changes of the force element 2 and of the compensation elements 3 occur, for example, when they are both composed of a material (e.g., a metallic material) having a higher thermal coefficient of expansion than the material (e.g., silicon) of the bending element 1 and the bending element 1, the force element 2 and the compensation elements 3 are simultaneously heated or cooled. The arrangement of the force element 2 and of the compensation elements 3 on the bending element 1 according to the present invention thus prevents or reduces flexing of the bending element 1 with changes in environmental temperature.

The force effect, caused by a change in the environmental temperature, of the force element 2 and of the compensation elements 3 on the bending element 1 depends on the respective thicknesses, surface areas, and thermal coefficients of expansion of the force element 2 and of the compensation elements 3. In this case, different materials can be used for the force element 2 and the compensation element 3. The respective thicknesses, surface areas, and thermal coefficients of expansion of the force element 2 and of the compensation elements 3 must, if necessary, be optimized empirically.

It is furthermore possible to interchange the positions of the force element 2 and of the compensation elements 3, that is, to locate force elements in the edge region 4 and compensation elements in the central region 5. In this case, the flexing directions of the bending element 1 with respect to the lengthening or shortening of the force element 2 or the compensation elements 3 would be opposite to that described above.

The length of the force element 2 can be varied independently of the length of the compensation elements 3. That is, the bending element 1 can be moved by correspondingly controlling the length of the force element 2. Possible effects by means of which the length of the force element 2 can be varied are, for example, a magnetostrictive effect, a piezoelectric effect, and a thermally dependent length change.

Varying the length of the force element by the magnetostrictive effect is described in the following. Thin magnetostrictive layers which can be fitted to bending elements are described in German Patent Application No. 42 20 226. If such a layer is used for the force element 2, the force element 2 is composed of a magnetostrictive terbium-dysprosium-iron alloy and is arranged in the magnetic field of a coil. When a current flows through the coil, the length of the force element 2 changes and the bending element 1 is flexed. In such an embodiment, the compensation elements 3 are composed of other metals which have no magnetostrictive effect and whose areas, thicknesses and thermal coefficients of expansion are matched such that they compensate for the force of the force element 2 on the bending element 1 caused by a change in the environmental temperature.

Varying the length of the force element by the piezoelectric effect is described in the following. The Petersen article describes the use of piezoelectric materials on bending elements. In such an arrangement, the force element 2 has an electrode on both its top and its bottom. An electrical field can be produced in the piezoelectric material of the force element 2 by applying a voltage across the electrodes. A typical material for a piezoelectric force element 2 would be, for example, zinc oxide. The lower electrode can be formed of a suitably doped bending element 1 composed of silicon. In this embodiment, the compensation elements 3 are also composed of piezoelectric layers which are designed such that no deflection, or only a negligible deflection, of the bending element 1 is produced in the event of simultaneous heating of the piezoelectric force element 2 and the compensation elements 3.

In frequency-analog (i.e., resonant) sensors for force, pressure, acceleration, etc., the force element 2 excites resonant oscillations while the compensation element 3 picks up the sensor signal. The voltage compensation described leads to the sensor signal reacting only very weakly to changes in the environmental temperature.

Varying the length of the force element 2 by a thermally dependant change length is described below. U.S. Pat. No. 5,058,856 describes the use of a force element which operates based on its thermal expansion. A heating element is arranged in the immediate vicinity of the force element so that the force element can be heated. When this principle is used for the micro-actuator of the present invention, the heating element must heat the force element 2 more than the compensation elements 3. This is accomplished by arranging the heating element directly in the immediate vicinity of (i.e., on or under), the force element 2 while arranging the compensation elements 3 in the vicinity of the fixed frame 6 thereby essentially remaining at the temperature of the frame 6.

The arrangements of bending elements 1 with the force element 2 and compensation elements 3 according to the present invention can be used in micro-valves such as those described in U.S. Pat. No. 5,058,856, micro-pumps such as those described in the Petersen article, or frequency-analog sensors such as those described in the Satchell article. The known bending elements are easily replaced by a bending element of the present invention. In the case of piezoelectric actuators, the flexing of the bending transducer resulting from the effect of the force element 2 can be increased by applying an operating voltage having a polarity opposite that of the voltage applied to the force element 2 to the compensation element 3. With the method of the present invention, compensating the environmental temperature is particularly simple. Since, other methods for compensating the environmental temperature can be used only with difficulty, the method of the present invention is particularly suitable for use in micro-valves, micro-pumps and frequency-analog sensors.

Due to the extraordinarily small nature of the components and due to the predominate use of the known semiconductor fabrication techniques, the design of micro-actuators, especially of micro-actuators composed of silicon, are extraordinarily limited. The methods described here for compensating temperature dependance are not limited to micro-actuators composed of silicon, but can be used for all micro-actuators.

Figure 2:
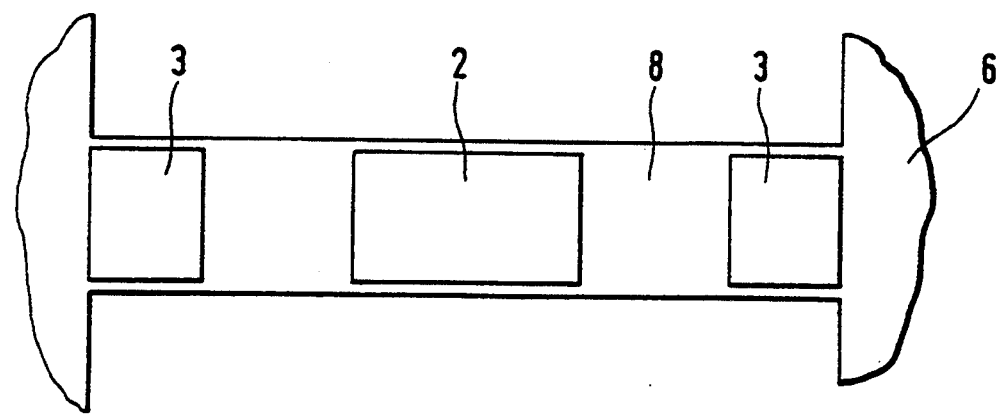
FIG. 2 is a plan view illustrating a bending beam of the present invention.

FIG. 2 is a plan view which illustrates the bending element as a bending beam 8. A longitudinal section through FIG. 2 would correspond to FIG. 1. The force element 2 is located in the central region on the bending beam 8 while the compensation elements 3 are located on the edge regions of the bending beam. The bending beam 8 is clamped in the frame 6 on both sides.

Figure 3:
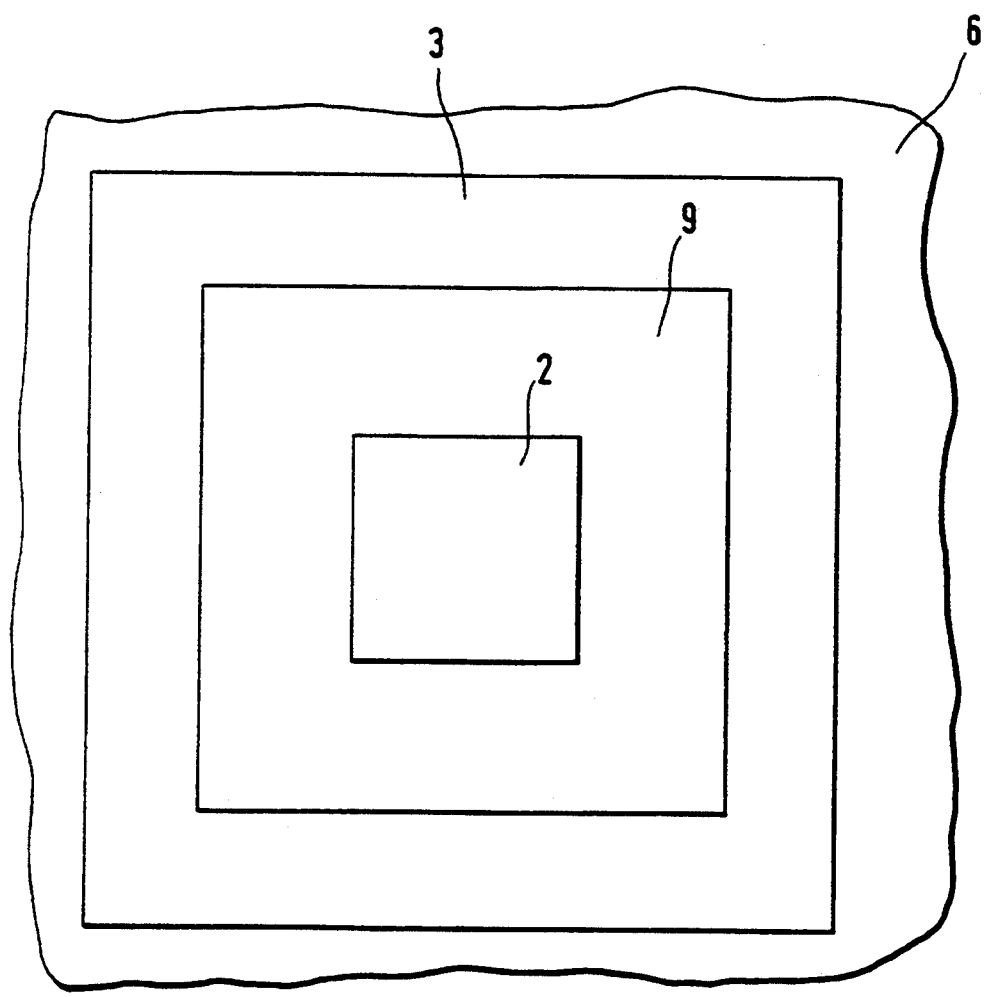
FIG. 3 is a plan view illustrating a membrane of the present invention.

FIG. 3 is a plan view which illustrates the bending element as a bending membrane 9. The bending membrane 9 is clamped in the frame 6 over its entire periphery. The force element 2 is arranged in the central region of the bending membrane 9 while the compensation element 3 is located in the edge region of the bending membrane 9. Other membrane shapes such as round membranes for example, can also be designed in a similar way.

Figure 4:
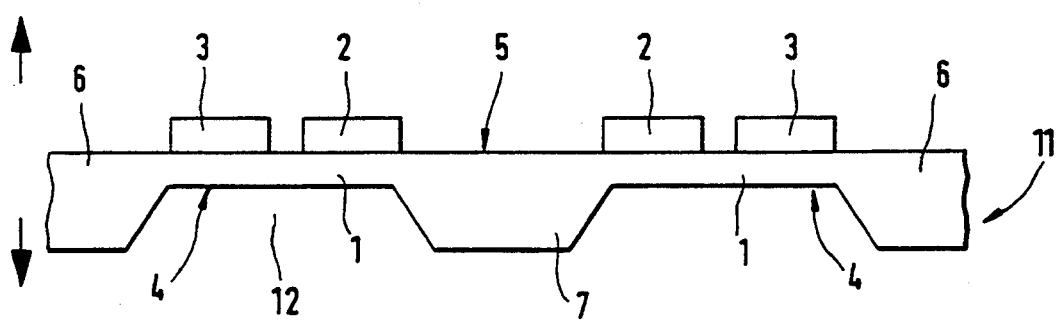
FIG. 4 is a side view illustrating a bending element having reinforcement in the central region.

FIG. 4 illustrates a bending element 1 which has a reinforcement 7 in its central region 5. Two force elements 2 are arranged on each side of the reinforcement 7 and on the upper surface of the bending element 1.

Two compensation elements 3 are arranged in the edge region 4 of the bending element 1, in the vicinity of the frame 6. The bending element shown here operates in an equivalent manner to the bending element from FIG. 1. When the two force elements 2 lengthen or shorten together, the reinforcement 7 moves such that its surface always remains parallel to the surface of the frame 6. This embodiment is particularly well suited for moving a micro-actuator in, for example, a micro-valve. A similar reinforcement is shown, for example, in the micro-valve according to the '856 patent.

Figure 5:
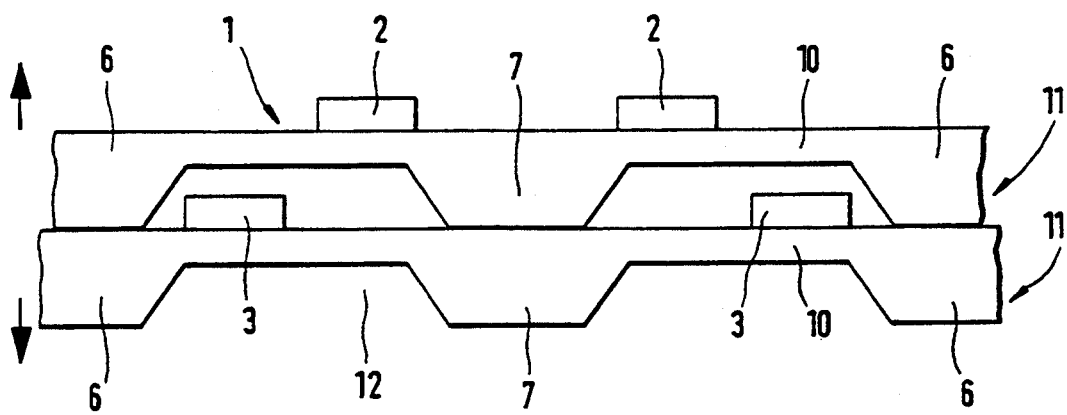
FIG. 5 is a cross sectional side view illustrating a bending element having a multiple bending beam or multiple membrane.

FIG. 5 illustrates a bending element 1 which includes a plurality of bending beams 10. A bending element 1 including a plurality of membranes can likewise be provided in a similar way. Each of the bending beams 10 has a reinforcement 7. The reinforcements 7 are firmly connected to one another so that the movements of the bending beams 10 cannot take place independent of one another. The frames 6 are likewise firmly connected to one another. Force elements 2 are arranged on the central region of one of the bending elements 10 at each side of the reinforcement 7.

Compensation elements 3 are arranged on the edge region of the other bending element 10. This arrangement once again results in the force effect of the force elements 2 and the force effect of the compensation elements 3 canceling one another out when the environmental temperature changes. In other respects, the method of operation of this bending element 1 corresponds to that of the bending element 1 as has been described in FIG. 1. This embodiment of the bending element 1 by means of a plurality of bending beams 10 allows a dedicated manufacturing process to be used for each of the bending beams 10. The type of manufacturing process used depends on whether a force element 2 or a compensation element 3 is to be arranged on the bending beam 10.

The micro-actuators illustrated in FIGS. 1 to 5 are fabricated from silicon wafers 11. Structures for the force elements 2 and for the compensation elements 3 are produced on the top of the silicon wafers 11 by means of conventional methods of thin-film or thick-film technology such as, for example, vapor-deposition or sputtering of thin films, or by screen printing of thick films. Furthermore, the recesses 12, which defines the bending elements 1 are incorporated in the bottom of the silicon wafer 11 by anisotropic etching techniques, for example. The depth of the recess 12 can be determined based on a time-controlled etching process or on etch-stop layers.

The use of multiple beam structures such as is shown in FIG. 5, allows the force elements 2 and the compensation elements 3 to be produced on separate silicon wafers 11 which are subsequently connected to one another with a bonding process. With multiple beam structures, optimized processes can then be used in each case for the manufacture of the force elements 2 and of the compensation elements 3.

In the embodiments of the present invention, the force elements 2 and compensation elements 3 are arranged on only one side of the silicon wafers 11 so as to be easily produced by the manufacturing methods being used in silicon technology. Other methods for temperature compensation, such as, for example, fitting force elements on the top of the wafer and compensation elements on the bottom of the wafer can only be produced with difficulty by silicon fabrication techniques being used.

If the force element 2 operates based on its thermal expansion, then a temperature difference must be ensured between the force element 2 and the compensation element 3. Such a temperature difference can be achieved much more simply if the force element and the compensation element 3 are arranged on different bending beams 10.

What is claimed is:

1. A micro-actuator, comprising:
    a) a bending element, said bending element having a first thermal coefficient of expansion;
    b) a force element, said force element
        i) having a variable length relative to said bending element,
        ii) being arranged on said bending element, and
        iii) having a second thermal coefficient of expansion different from the first thermal coefficient of expansion of said bending element; and
    c) a compensation element, said compensation element
        i) having a third thermal coefficient of expansion different from the first thermal coefficient of expansion of said bending element, and
        ii) being arranged on said bending element,
    wherein said compensation element compensates for a force effect of said force element on said bending element resulting from a change in environmental temperature.

2. The micro-actuator according to claim 1, further comprising a rigid frame,
    wherein said bending element includes edge regions and a central region arranged within said edge regions,
    wherein said bending element is clamped in said rigid frame in at least two mutually opposite edge regions,
    wherein said force element is arranged in one of an edge region and said central region, and said compensation element is arranged in the other of said edge region and said central region.

3. The micro-actuator according to claim 2, further comprising:
    (d) a reinforcement located in said central region of said bending element,
        wherein any of said force element and said compensation element arranged in said central region are located on the edge of said reinforcement.

4. The micro-actuator according to claim 1, wherein said bending element is formed as a bending beam.

5. The micro-actuator according to claim 1, wherein said bending element is formed as a bending membrane.

6. The micro-actuator according to claim 1, wherein said bending element includes multiple bending beams connected to one another.

7. The micro-actuator according to claim 1, wherein said bending element includes multiple membranes connected to one another.

8. The micro-actuator according to claim 6, wherein each of said multiple bending beams has one of only force elements and only compensation elements.

9. The micro-actuator according to claim 7, wherein each of the multiple bending membranes has one of only force elements and only compensation elements.

10. The micro-actuator of claim 1, wherein said bending element is fabricated from a single-crystal silicon wafer.

11. The micro-actuator according to claim 1, wherein the length of said force element is varied by one of a magnetostrictive effect, a piezoelectric effect, and a thermally caused length change.

12. The micro-actuator according to claim 1, wherein the micro-actuator is used for driving one of a micro-valve, a micro-pump, and a frequency-analog sensor.

* * * * *